(12) United States Patent
Yoon et al.

(10) Patent No.: US 11,815,559 B2
(45) Date of Patent: Nov. 14, 2023

(54) APPARATUS AND METHOD FOR DIAGNOSING BATTERY CELL

(71) Applicant: LG ENERGY SOLUTION, LTD., Seoul (KR)

(72) Inventors: Sung Yul Yoon, Daejeon (KR); Dong Keun Kwon, Daejeon (KR); Hyun Chul Lee, Daejeon (KR); Seung Hyun Kim, Daejeon (KR); An Soo Kim, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 114 days.

(21) Appl. No.: 17/610,109

(22) PCT Filed: Jul. 3, 2020

(86) PCT No.: PCT/KR2020/008751
§ 371 (c)(1),
(2) Date: Nov. 9, 2021

(87) PCT Pub. No.: WO2021/006566
PCT Pub. Date: Jan. 14, 2021

(65) Prior Publication Data
US 2022/0221527 A1    Jul. 14, 2022

(30) Foreign Application Priority Data
Jul. 5, 2019   (KR) .................. 10-2019-0081391

(51) Int. Cl.
*G01R 31/00*   (2006.01)
*G01R 31/52*   (2020.01)
(Continued)

(52) U.S. Cl.
CPC ........... *G01R 31/52* (2020.01); *G01R 31/367* (2019.01); *G01R 31/388* (2019.01)

(58) Field of Classification Search
USPC ......................................... 324/426, 432–435
See application file for complete search history.

(56) References Cited

U.S. PATENT DOCUMENTS

| 2007/0024242 A1 | 2/2007 | Seo et al. |
| 2011/0148426 A1 | 6/2011 | Yokotani |
| | | (Continued) |

FOREIGN PATENT DOCUMENTS

| CN | 1909280 A | 2/2007 |
| CN | 102104180 A | 6/2011 |
| | (Continued) | |

OTHER PUBLICATIONS

Extended European search report dated Jun. 9, 2022 for European Application No. 20837837.2.
(Continued)

*Primary Examiner* — Vincent Q Nguyen
(74) *Attorney, Agent, or Firm* — Birch, Stewart, Kolasch & Birch, LLP

(57) ABSTRACT

An apparatus for diagnosing a battery cell according to an embodiment may include a voltage measurer that measures a voltage of each battery cell of a battery module in a state of an open circuit voltage of a battery, a memory that stores the measured voltage at predetermined time intervals, and an abnormality detector that compares a current measured voltage with a measured voltage before a preset time for each battery cell and determines that an abnormality has occurred in a first battery cell among the battery cells when a difference between the current measured voltage of the at least one battery cell and the measured voltage of the at least one battery cell before the preset time exceeds a reference value.

17 Claims, 7 Drawing Sheets

(51) Int. Cl.
*G01R 31/388* (2019.01)
*G01R 31/367* (2019.01)

(56) References Cited

U.S. PATENT DOCUMENTS

| | | | |
|---|---|---|---|
| 2011/0181246 A1 | 7/2011 | Tae et al. | |
| 2011/0254559 A1 | 10/2011 | Nakashima et al. | |
| 2013/0088201 A1 | 4/2013 | Iwasawa et al. | |
| 2014/0266229 A1 | 9/2014 | McCoy | |
| 2016/0193925 A1 | 7/2016 | Takada et al. | |
| 2017/0154479 A1* | 6/2017 | Kim | G05B 19/042 |
| 2018/0041055 A1* | 2/2018 | Nakamoto | H01M 10/482 |
| 2018/0183252 A1 | 6/2018 | Kim et al. | |
| 2019/0178950 A1 | 6/2019 | Wu et al. | |
| 2019/0299972 A1* | 10/2019 | Honjo | B60W 40/13 |
| 2020/0198695 A1* | 6/2020 | Kawamura | B62D 5/0463 |
| 2021/0286020 A1* | 9/2021 | Tawa | H01M 10/4285 |

FOREIGN PATENT DOCUMENTS

| | | | |
|---|---|---|---|
| CN | 106356939 A | 1/2017 | |
| CN | 106802396 A | 6/2017 | |
| CN | 107192914 A | 9/2017 | |
| CN | 107340475 A | 11/2017 | |
| CN | 108107364 A | 6/2018 | |
| CN | 108717167 A | 10/2018 | |
| CN | 108957349 A | 12/2018 | |
| CN | 109932661 A | 6/2019 | |
| JP | 3437823 B2 | 8/2003 | |
| JP | 2006-337155 A | 12/2006 | |
| JP | 2007-40991 A | 2/2007 | |
| JP | 2010-208539 A | 9/2010 | |
| JP | 2012-95411 A | 5/2012 | |
| JP | 5391749 B2 | 1/2014 | |
| JP | 2014-26732 A | 2/2014 | |
| JP | 5564561 B2 | 7/2014 | |
| JP | 5879983 B2 | 7/2014 | |
| JP | 2015-90806 A | 5/2015 | |
| JP | 2016-176709 A | 10/2016 | |
| JP | 2017-166877 A | 9/2017 | |
| JP | 2018-67498 A | 4/2018 | |
| JP | 6527356 B2 | 6/2019 | |
| KR | 10-0717789 B1 | 5/2007 | |
| KR | 10-2011-0062130 A | 6/2011 | |
| KR | 10-1057542 B1 | 8/2011 | |
| KR | 10-2011-0139187 A | 12/2011 | |
| KR | 10-1367860 B1 | 2/2014 | |
| KR | 10-2015-0132370 A | 11/2015 | |
| KR | 10-1779245 B1 | 9/2017 | |
| KR | 10-2018-0071798 A | 6/2018 | |
| WO | WO 2015/019834 A1 | 2/2015 | |

OTHER PUBLICATIONS

International Search Report for PCT/KR2020/008751 (PCT/ISA/210) dated Oct. 6, 2020.

* cited by examiner

Conventional Art

APPARATUS AND METHOD FOR DIAGNOSING BATTERY CELL

TECHNICAL FIELD

Cross-Reference to Related Applications

This application claims the benefit of Korean Patent Application No. 10-2019-0081391, filed on Jul. 5, 2019, in the Korean Intellectual Property Office, the disclosure of which is incorporated herein in its entirety by reference.

TECHNICAL FIELD

The present invention relates to an apparatus and method for diagnosing a battery cell for detecting instantaneous voltage fluctuation that may occur due to an internal short circuit of the battery cell.

BACKGROUND ART

Recently, research and development on a secondary battery are being actively conducted. Here, the secondary battery is a battery capable of charging and discharging, and is meant to include all of a conventional Ni/Cd battery, Ni/MH battery, etc. and a recent lithium ion battery. Among the secondary batteries, the lithium ion battery has an advantage of having much higher energy density compared to the conventional Ni/Cd battery, Ni/MH battery, etc. In addition, the lithium ion battery can be manufactured in a small size and light weight, and thus the lithium ion battery is used as a power source for a mobile device. In addition, the lithium ion battery is attracting attention as a next-generation energy storage medium as its range of use has been expanded to a power source for an electric vehicle.

In addition, the secondary battery is generally used as a battery pack including a battery module in which a plurality of battery cells are connected in series and/or in parallel. In addition, a state and operation of the battery pack are managed and controlled by a battery management system (BMS).

In particular, in an energy storage system (ESS) field, when a short circuit occurs inside a cell of a battery module, it may damage not only the battery but also the entire ESS system. However, conventionally, there has been no method capable of early detection of an internal short circuit of the battery cell.

In addition, conventionally, by measuring a voltage across each cell in the battery module in real time, detection has been performed only on a portion outside the operating range such as low voltage or high voltage. Therefore, in the conventional ESS system, detection of an abnormality in cell voltage behavior due to an instantaneous internal short circuit of a battery cell has not been achieved.

DISCLOSURE OF THE INVENTION

Technical Problem

The present invention has been made to solve the problems described above, and an object thereof is to provide an apparatus and method for diagnosing a battery cell which are capable of detecting an abnormality in cell voltage behavior due to an instantaneous internal short circuit of the battery cell.

Technical Solution

An apparatus for diagnosing battery cells in a battery module of a battery according to an embodiment of the present invention includes a voltage measurer configured to measure a voltage of each battery cell of the battery module in a state of an open circuit voltage of the battery, a memory that stores the measured voltage at predetermined time intervals, and an abnormality detector configured to compare a current measured voltage with a measured voltage before a preset time for each battery cell and determine that an abnormality has occurred in at least one battery cell among the battery cells when a difference between the current measured voltage of the at least first battery cell and the measured voltage of at least the first battery cell before the preset time exceeds a reference value.

In the apparatus for diagnosing the battery cells according to the embodiment of the present invention, the preset time may be 5 seconds.

The abnormality detector of the apparatus for diagnosing the battery cells according to the embodiment of the present invention may perform abnormality diagnosis of the at least one battery cell when a state in which the current flowing through the battery module is 0 continues for at least 10 seconds, and a state of charge (SOC) of the at least one battery cell is equal to or greater than a preset numerical value.

The abnormality detector of the apparatus for diagnosing the battery cells according to the embodiment of the present invention may perform an abnormality diagnosis of the at least one battery cell when 10 seconds have elapsed from a time point when charging or discharging of the battery is finished and the current flowing through the battery module is 0.

In the apparatus for diagnosing the battery cells according to the embodiment of the present invention, the preset numerical value of the SOC may be 30%.

In the apparatus for diagnosing the battery cells according to the embodiment of the present invention, the difference between the current measured voltage and the measured voltage before the preset time may include both a voltage drop amount and a voltage rise amount of the at least one battery cell.

The abnormality detection unit of the apparatus for diagnosing the battery cells according to the embodiment of the present invention may determine that an abnormality has occurred in the at least one battery cell when the state in which the difference between the current measured voltage of at least one and the measured voltage of at least one before the preset time exceeds the reference value occurs at least two times in succession.

In the apparatus for diagnosing the battery cells according to the embodiment of the present invention, the reference value may be 10 mV.

An apparatus for diagnosing battery cells in a battery module of a battery according to another embodiment of the present invention includes a voltage measurer that measures a voltage of each battery cell of the battery module in a state of an open circuit voltage of the battery, an SOC calculator that calculates an SOC of each battery cell of the battery module based on the measured voltage, a memory that stores the measured voltage and the calculated SOC at predetermined time intervals, and an abnormality detector configured to compare a current SOC with an SOC before a preset time for each battery cell and determine that an abnormality has occurred in at least one battery cell among the battery cells when a difference between the current SOC and the SOC before the preset time exceeds a reference value.

A method for diagnosing battery cells in a battery module of a battery, the method according to an embodiment of the present invention includes measuring a voltage of each battery cell of the battery module in a state of an open circuit voltage of the battery, storing the measured voltage at predetermined time intervals, comparing a current measured voltage with a measured voltage before a preset time for each battery cell, and determining that an abnormality has occurred in at least one battery cell among the battery cells when a difference between the current measured voltage of the at least one battery cell and the measured voltage of the at least one battery cell before the preset time exceeds a reference value.

In the method for diagnosing the battery cells according to the embodiment of the present invention, the preset time may be 5 seconds.

The method for diagnosing the battery cells according to the embodiment of the present invention further includes, before the comparing the current measured voltage with the measured voltage before the preset time for each battery cell, measuring a current flowing through the battery module and an SOC of the at least one battery cell, in which comparing the current measured voltage and the measured voltage before the preset time may be performed when a state in which the current flowing through the battery module is 0 continues for at least 10 seconds and a state of charge (SOC) of the at least one battery cell is equal to or greater than a preset numerical value.

The method for diagnosing the battery cells according to the embodiment of the present invention further includes, before the comparing the current measured voltage with the measured voltage before the preset time for each battery cell, measuring a current flowing through the battery module, in which the comparing the current measured voltage with the measured voltage before the preset time for each battery cell may be performed when 10 seconds have elapsed from a time point when charging or discharging of the battery is finished and the current flowing through the battery module is 0 in the measuring the current flowing through the battery module.

In the method for diagnosing the battery cells according to the embodiment of the present invention, the preset numerical value of the SOC may be 30%.

In the method for diagnosing the battery cells according to the embodiment of the present invention, the difference between the current measured voltage and the measured voltage before the preset time may include both a voltage drop amount and a voltage rise amount of the at least one battery cell.

In the method for diagnosing the battery cells according to the embodiment of the present invention, it may be determined that an abnormality has occurred in the at least one battery cell when a case in which the difference between the current measured voltage of at least one and the measured voltage of at least one before the preset time exceeds the reference value occurs at least two times in succession, in the determining that the abnormality has occurred in the at least one battery cell.

A method for diagnosing battery cells in a battery module of a battery according to another embodiment of the present invention includes measuring a voltage of each battery cell of the battery module in a state of an open circuit voltage of the battery, calculating an SOC of each battery cell of the battery module based on the measured voltage, storing the calculated SOC at predetermined time intervals, comparing a current SOC with an SOC before a preset time for each battery cell, and determining that an abnormality has occurred in at least one battery cell among the battery cells when a difference between the current SOC of the at least one and the SOC of the at least one before the preset time exceeds a reference value.

Advantageous Effects

According to an apparatus and method for diagnosing a battery cell according to an embodiment of the present invention, an abnormality in cell voltage behavior due to an instantaneous internal short circuit of the battery cell can be detected early.

BRIEF DESCRIPTION OF THE DRAWINGS

The following drawings attached to the specification illustrate preferred examples of the present invention by example, and serve to enable technical concepts of the present invention to be further understood together with detailed description of the invention given below, and therefore the present invention should not be interpreted only with matters in such drawings.

MODE FOR CARRYING OUT THE INVENTION

Figure 1:
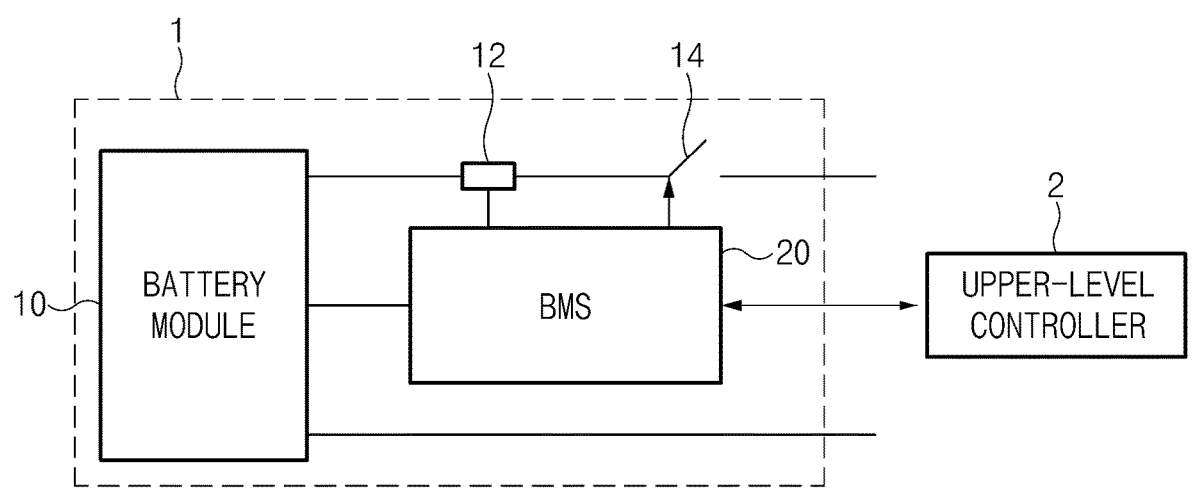
FIG. 1 is a block diagram illustrating a configuration of a general battery management system.

Hereinafter, various embodiments of the present invention will be described in detail with reference to the accompanying drawings. In this document, the same reference numerals are used for the same constituent elements in the drawings, and duplicate descriptions for the same constituent elements are omitted.

With respect to the various embodiments of the present invention disclosed in this document, specific structural or functional descriptions have been exemplified for the purpose of describing the embodiments of the present invention only, and various embodiments of the present invention can be embodied in various forms and should not be construed as being limited to the embodiments described in this document.

Expressions such as "first", "second", "firstly", or "secondly", etc. used in various embodiments can modify various constituent elements regardless of order and/or importance, and does not limit corresponding constituent elements. For example, without departing from the scope of the present invention, a first constituent element can be named as a second constituent element, and similarly, the second constituent element can also be named as the first constituent element.

The terms used in this document are only used to describe a specific embodiment, and may not be intended to limit the scope of other embodiments. Singular expressions may include plural expressions unless the context clearly indicates otherwise.

All terms used herein, including technical or scientific terms, may have the same meaning as generally understood by a person of ordinary skill in the art. Terms defined in a generally used dictionary may be interpreted as having the same or similar meaning as the meaning in the context of the related technology, and are not to be interpreted as an ideal or excessively formal meaning unless explicitly defined in this document. In some cases, even terms defined in this document cannot be interpreted to exclude embodiments of the present invention.

FIG. 1 is a block diagram illustrating a configuration of a battery control system. Referring to FIG. 1, a configuration diagram schematically illustrating a battery control system including a battery pack 1 and an upper-level controller 2 included in an upper-level system according to an embodiment of the present invention is illustrated.

As illustrated in FIG. 1, the battery pack 1 includes a battery module 10 composed of one or more battery cells and capable of charging and discharging, a switching unit 14 connected in series to the +terminal side or the −terminal side of the battery module 10 to control a charge/discharge current flow of the battery module 10, and a battery management system 20 that monitors the voltage, current, temperature, etc. of the battery module 10 and controls and manages to prevent overcharging and overdischarging. Here, although the battery management system 20 is described as being connected to the battery module, the battery management system 20 may also be connected to each battery cell to monitor and measure the voltage and current temperature of the battery cells. A battery cell management system is disposed for each battery cell, and each of a plurality of battery cell management systems may transmit and receive data with the battery management system 20 that monitors and controls the battery module. The operation and function of the battery cell management system is similar to those of the battery management system 20.

Here, the switching unit 14 is a semiconductor switching element for controlling the current flow for charging or discharging the battery module 10, and, for example, at least one MOSFET can be used.

In addition, the BMS 20 can measure or calculate a voltage and current of a gate, source, drain, etc. of the semiconductor switching element in order to monitor a voltage, current, temperature, etc. of the battery module 10, and can also measure the current, voltage, temperature, etc. of the battery module by using a sensor 12 provided adjacent to the semiconductor switching element. The BMS 102 is an interface that receives values obtained by measuring the various parameters described above, and can include a plurality of terminals and a circuit connected to these terminals to perform processing of input values.

In addition, the BMS 20 can control ON/OFF of the switching element 14, for example, a MOSFET, and may be connected to the battery module 10 to monitor the state of the battery module 10.

The upper-level controller 2 can transmit a control signal for the battery module to the BMS 20. Accordingly, the operation of the BMS 20 can also be controlled based on a signal applied from the upper-level controller 2. The battery cell of the present invention can be configured to be included in a battery pack used for an ESS or a vehicle. However, it is not limited to these uses. However, the battery cell is not limited to these uses.

Since the configuration of the battery pack 1 and the configuration of the BMS 20 are known configurations, a more detailed description will be omitted.

Meanwhile, the apparatus for diagnosing the battery cell according to embodiments of the present invention can be connected to each of a plurality of battery cells connected in series in the battery module 10 to determine an abnormality of the battery cell.

Figure 2:
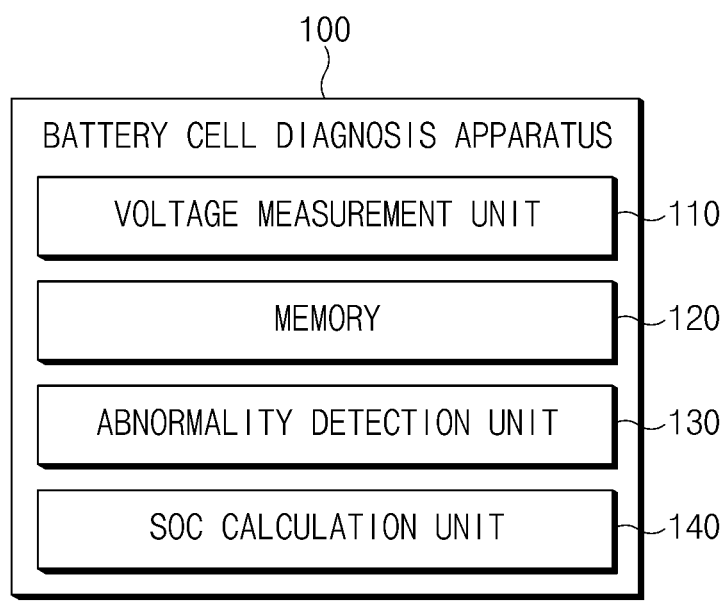
FIG. 2 is a block diagram illustrating a configuration of an apparatus for diagnosing battery cells according to an embodiment of the present invention.

FIG. 2 is a block diagram illustrating a configuration of an apparatus for diagnosing battery cells according to an embodiment of the present invention. Here, the apparatus for diagnosing the battery cell corresponds to the battery cell management system described above.

Referring to FIG. 2, an apparatus 100 for diagnosing battery cells according to an embodiment of the present invention can include a voltage measurement unit 110, a memory 120, an abnormality detection unit 130, and an SOC calculation unit 140.

The voltage measurement unit 110 can measure the voltage of each battery cell of the battery module in a state of an open circuit voltage of a battery. In this case, the open circuit voltage of the battery may mean a voltage measured in a state in which the battery cell is not charged or discharged, that is, in a rest state.

In addition, the voltage measurement unit 110 can measure the voltage of each battery cell in the state of the open circuit voltage of the battery at predetermined time intervals. For example, the voltage measurement unit 110 can measure the voltage of the battery cell every second. However, the present invention is not limited thereto, and the voltage measurement unit 110 can measure the voltage at various time intervals set by the user.

The memory 120 can store the voltage measured by the voltage measurement unit 210 and an SOC calculated by the SOC calculation unit 140 at predetermined time intervals. For example, the memory 120 can store the voltage measured by the voltage measurement unit 110 and the SOC calculated by the SOC calculation unit 140 every second.

The abnormality detection unit 130 can compare the current measured voltage with the measured voltage before a preset time for each battery cell of the battery, and can determine that an abnormality has occurred in the battery cell of the battery when the difference between the current measured voltage and the measured voltage before the preset time exceeds a reference value.

For example, the measured voltage before the preset time may be a measured voltage 5 seconds before the present. In this case, the abnormality detection unit 130 can determine a battery cell abnormality of the battery according to the following equation.

$$|v(t) - v(t-5)| > 10 \text{ mV}$$

The above equation represents a case where the reference value is 10 mV. However, the reference value is not limited thereto, and the reference value may be appropriately set depending on a case. For example, the reference value may be set in consideration of an error range of the voltage measurement unit 110. The difference between the current measured voltage and the measured voltage before the preset time is an absolute value, and may include not only a voltage drop amount of the battery cell but also a voltage rise amount of the battery cell.

The abnormality detection unit 130 can compare a current SOC calculated by the SOC calculation unit 140 and an SOC before a preset time for each battery cell, and determine that an abnormality has occurred in the battery cell when the difference between the current SOC and the SOC before the preset time exceeds a reference value. For example, the reference value may be 3% of the total SOC.

In addition, the abnormality detection unit 130 can compare the current measured voltage (or SOC) and the measured voltage (or SOC) before a preset time for each battery cell only when a preset condition is satisfied. In this case, the preset condition may include a condition that a state, in which the current flowing through the battery module is 0, continues for 10 seconds or more and the SOC of the battery cell is greater than or equal to a preset numerical value. For example, the preset numerical value of the SOC may include one that the SOC is 30% or more. The reason is that each battery cell model has an OCV characteristic curve and it is intended to prevent erroneous detection by excluding a SOC section where a steep slope appears.

In addition, the abnormality detection unit 130 can perform abnormality diagnosis of a battery cell when 10 seconds has elapsed from the time point when charging or discharging of the battery is finished and the current flowing through the battery module is 0.

The abnormality detection unit 130 can determine that an abnormality has occurred in the battery cell when the state in which the difference between the current measured voltage and the measured voltage before the preset time exceeds the reference value has occurred two or more times in succession. Through this, the abnormality detection unit 130 can increase accuracy of abnormality detection of the battery cell of the battery.

The SOC calculation unit 140 can calculate the SOC of each battery cell of the battery module based on the voltage measured by the voltage measurement unit 110. The SOC calculation unit 140 can calculate the SOC by considering various factors such as current, temperature, pressure, etc. of each battery cell as well as voltage of each battery cell of the battery module.

Here, the SOC calculation method of the battery cell may be classified according to a parameter used as a criterion for determining a residual amount. An Ah method is a method that calculates a used capacity using a relationship between the current and time used and reflects the used capacity in the SOC, and a resistance measurement method is a method of calculating a residual amount based on the relationship between an internal resistance-drop (IR-drop) of the battery and the SOC. In addition, a voltage measurement method is a method of measuring an open circuit voltage (OCV) of a battery terminal and calculating a residual amount based on the relationship between the OCV and SOC measured in advance.

For example, in the case of the apparatus for diagnosing the battery cell according to an embodiment of the present invention, the SOC may be calculated using the voltage measurement method. However, this is only an example and the SOC calculation method is not limited to the methods described above.

In addition, according to the apparatus for diagnosing the battery cell 100 of FIG. 2 according to the embodiment, the abnormality detection unit 130 can compare the current measured voltage and SOC with the measured voltage and SOC before a preset time for each battery cell of the battery, and can determine that an abnormality has occurred in the battery cell when the difference between the current measured voltage and SOC and the measured voltage and SOC before the preset time exceeds a reference value.

By using both the measured voltage and the SOC of the battery cell in this way, it is possible to improve the accuracy in detecting an abnormality in cell voltage behavior due to an instantaneous internal short circuit of each battery cell of the battery.

Figure 3A:
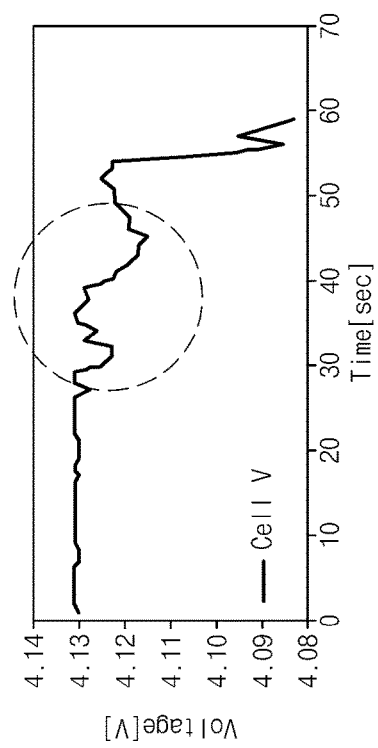
FIGS. 3A and 3B illustrate a method of detecting an abnormality in cell voltage behavior due to an instantaneous internal short circuit of a battery cell by the apparatus for diagnosing the battery cell according to the embodiment of the present invention.
Figure 3B:
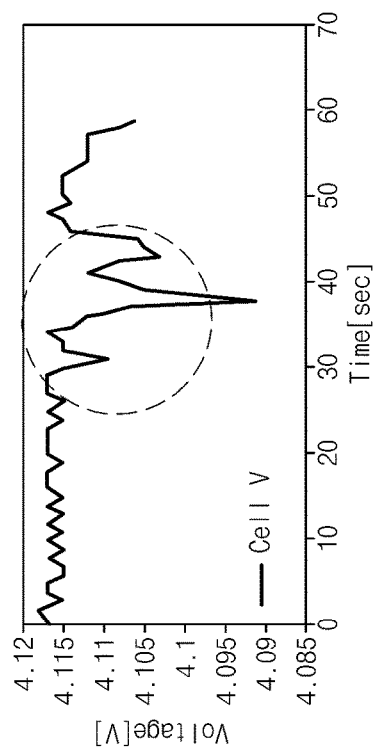

FIGS. 3A and 3B illustrate a method of detecting an abnormality in cell voltage behavior due to an instantaneous internal short circuit of a battery cell by the apparatus for diagnosing the battery cell according to the embodiment of the present invention.

In the upper graphs of FIGS. 3A and 3B, the horizontal axis represents time (seconds), and the vertical axis represents voltage (V). In addition, the lower tables of FIGS. 3A and 3B lists the measured voltage of each battery cell of the battery module and the voltage before a predetermined time, by time. In this case, in the examples of FIGS. 3A and 3B, it is assumed that the reference value for detecting an abnormality in cell voltage behavior due to an instantaneous internal short circuit of the battery cell is 10 mV.

Referring to FIG. 3A, for a voltage of 4.117 V measured at 43 seconds, the voltage w V and the voltage before 5 seconds is 4.128 V, and thus the difference is 12 mV and 11 mV, respectively. Accordingly, the apparatus for diagnosing battery cells according to an embodiment of the present invention may determine that the abnormality in cell voltage behavior due to the instantaneous internal short circuit of the battery cell has occurred at 43 seconds.

In addition, the voltage before 5 seconds is 4.129 V with respect to the voltage of 4.117 V measured at 44 seconds, and thus the difference is 12 mV. Accordingly, the apparatus for diagnosing the battery cell according to the embodiment of the present invention may determine that the abnormality in cell voltage behavior due to the instantaneous internal short circuit of the battery cell has occurred at 44 seconds.

Also, in the case of FIG. 3B, similar to FIG. 3A, the difference between the voltages measured at 37 seconds to 40 seconds and the voltage before a predetermined time (e.g., 1 second or more) is 10 mV or more, it can be determined that the abnormality in cell voltage behavior due to the instantaneous internal short circuit of the battery cell has occurred.

Figure 4:
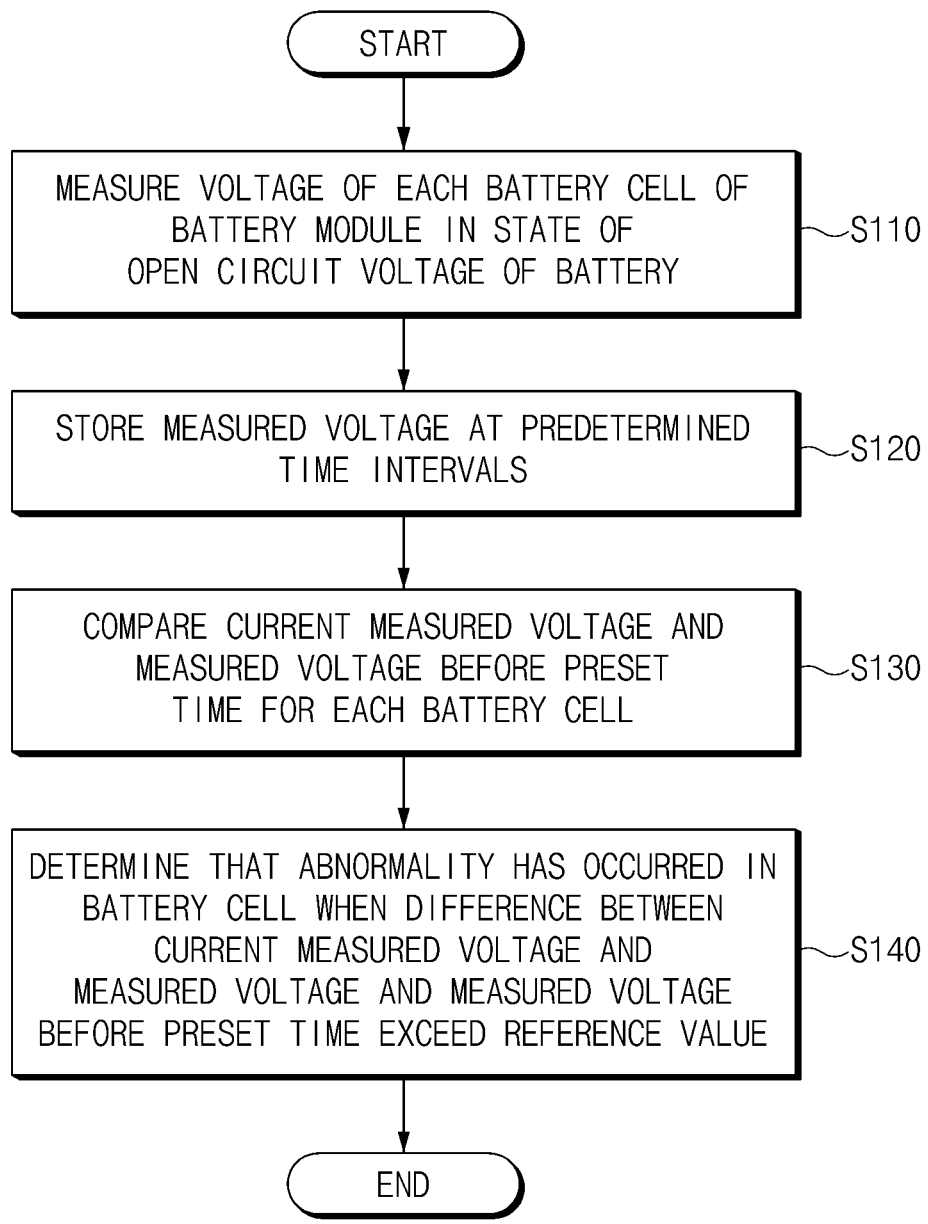
FIG. 4 is a flowchart illustrating a method for diagnosing battery cells according to an embodiment of the present invention.

FIG. 4 is a flowchart illustrating a method for diagnosing battery cells according to an embodiment of the present invention.

First, when diagnosing battery cells according to an embodiment of the present invention, the voltage of each battery cell of the battery module can be measured in a state of an open circuit voltage of the battery (S110). In this case, the open circuit voltage of the battery may mean a voltage measured in a state in which the battery cell is not charged or discharged, that is, in a rest state.

In this case, the voltage of each battery cell in the state of the open circuit voltage of the battery can be measured at predetermined time intervals, for example, every second interval. The voltage of each battery cell can be measured.

Next, the measured voltage may be stored at a predetermined time interval (S120). In this case, the voltage measured every second may be stored in the memory. In addition, for each battery cell, a current measured voltage and a measured voltage before a preset time may be compared (S130). In this case, the preset time may be 5 seconds.

In addition, before comparing the current measured voltage with the measured voltage before the preset time for each battery cell, measuring a current flowing through the battery module and an SOC of the battery cell can be further included. In the measuring the current flowing through the battery module and the SOC of the battery cell, when the state in which the current flowing through the battery module is 0 continues for 10 seconds or more and the SOC of the battery cell is greater than or equal to a preset value, comparing the current measured voltage with the measured voltage before the preset time may be performed for each battery cell. In this case, the preset value of SOC may include one that the SOC is 30% or more.

In addition, before the comparing the current measured voltage and the measured voltage before the preset time for each battery cell, the measuring the current flowing through the battery module can be further included. In the measuring the current flowing through the battery module, when 10 seconds have elapsed from the time point when charging or discharging of the battery is finished and the current flowing through the battery module is 0, the comparing the current measured voltage and the measured voltage before the preset time for each battery cell can be performed.

As described above, the difference between the current measured voltage and the measured voltage before the preset time is an absolute value and may include not only the voltage drop amount of the battery cell but also the voltage rise amount of the battery cell.

In addition, when the difference between the current measured voltage and the measured voltage before the preset time exceeds the reference value, it may be determined that an abnormality has occurred in the battery cell (S140). In this case, when the case in which the difference between the current measured voltage and the measured voltage before the preset time exceeds the reference value has occurred two or more times in succession, it may be determined that an abnormality has occurred in the battery cell.

Figure 5:
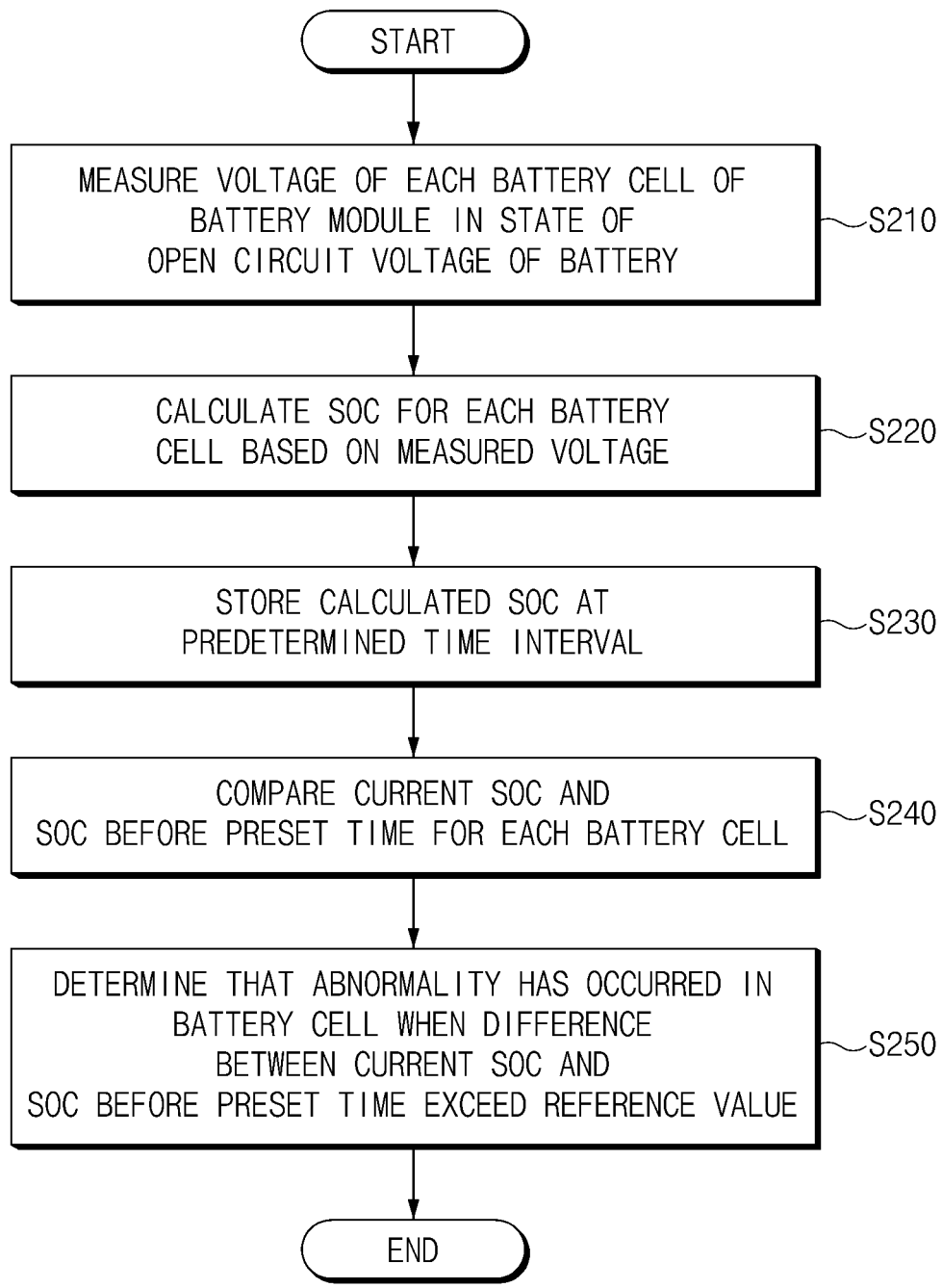
FIG. 5 is a flowchart illustrating a method for diagnosing battery cells according to another embodiment of the present invention.

FIG. 5 is a flowchart illustrating a method for diagnosing battery cells according to another embodiment of the present invention.

First, it is possible to measure the voltage of each battery cell of the battery module in the state of an open circuit voltage of the battery (S210). In addition, the SOC of each battery cell of the battery module can be calculated based on the measured voltage (S220). In this case, the SOC may be calculated by considering various factors such as current, temperature, pressure, etc. of each battery cell as well as the voltage of each battery cell of the battery module.

Next, the measured voltage and the calculated SOC can be stored at predetermined time intervals (S230). In addition, for each battery cell, the current SOC and the SOC before a preset time can be compared (S240). When the difference between the current SOC and the SOC before the preset time exceeds the reference value, it may be determined that an abnormality has occurred in the battery cell (S250).

Meanwhile, although not illustrated in FIG. 5, by comparing both the measured voltage and the SOC of each battery cell of the battery module, it is possible to detect an abnormality in cell voltage behavior due to an instantaneous internal short circuit of the battery cell.

Figure 6:
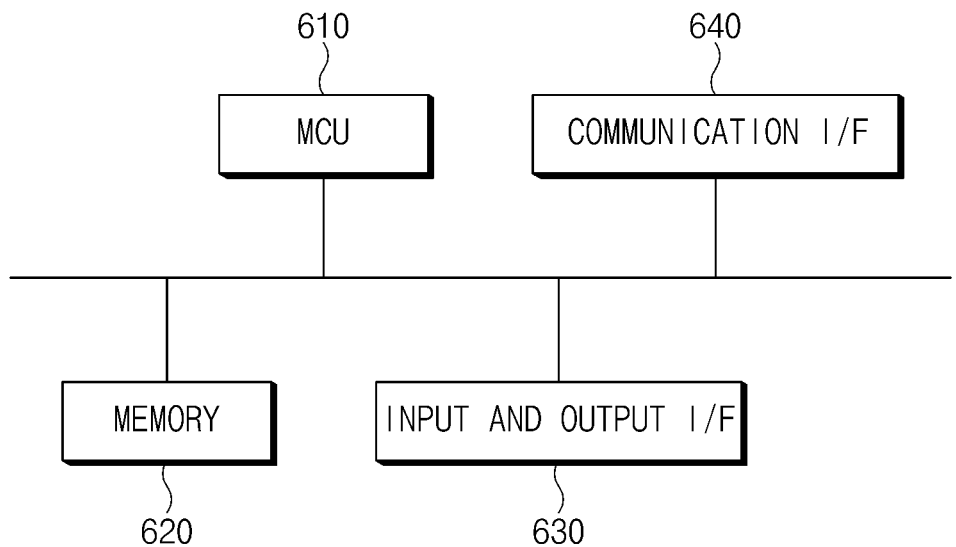
FIG. 6 is a block diagram illustrating a hardware configuration of an apparatus for diagnosing battery cells according to an embodiment of the present invention.

FIG. 6 is a block diagram illustrating a hardware configuration of an apparatus for diagnosing battery cells according to an embodiment of the present invention.

As illustrated in FIG. 6, an apparatus 600 for diagnosing battery cells can include a microcontroller (MCU) 610 that controls various processes and configurations, a memory 620 in which an operating system program and various programs (e.g., a battery pack abnormality diagnosis program or a battery pack temperature estimation program), etc. are recorded, an input and output interface 630 that provides an input interface and an output interface between the battery cell module and/or switching unit (e.g., semiconductor switching element), and a communication interface 640 capable of communicating with the outside (e.g., upper-level controller) through a wired or wireless communication network. In this way, the computer program according to the present invention is recorded in the memory 620 and processed by the microcontroller 610, and thus, may be implemented as, for example, a module that performs the respective functional blocks illustrated in FIG. 2.

In this way, according to the apparatus and method for diagnosing battery cells according to an embodiment of the present invention, an abnormality in cell voltage behavior due to an instantaneous internal short circuit of the battery cell can be detected early.

In the above description, just because all the constituent elements constituting an embodiment of the present invention are described as being combined into one or operating in combination, the present invention is not necessarily limited to these embodiments. That is, as long as it is within the scope of the object of the present invention, all of the constituent elements may be selectively combined and operated in one or more.

In addition, the terms such as "include", "configure" or "have" described above mean that the corresponding the constituent element can be embedded unless otherwise described, and thus it should be interpreted as not excluding other constituent elements, but can further include other constituent elements. All terms used herein including technical or scientific terms may have the same meaning as generally understood by a person of ordinary skill in the art, unless otherwise defined. Terms generally used, such as terms defined in the dictionary, should be interpreted as being consistent with the meaning of the context of the related technology, and are not to be interpreted as an ideal or excessively formal meaning unless explicitly defined in the present invention.

The above description is merely illustrative of the technical idea of the present invention, and those of ordinary skill in the art to which the present invention pertains will be able to make various modifications and variations without departing from the essential characteristics of the present invention. Accordingly, the embodiments disclosed in the present invention are not intended to limit the technical idea of the present invention, but to explain the technical idea, and the scope of the technical idea of the present invention is not limited by these embodiments. The scope of protection of the present invention should be interpreted by the claims set forth below, and all technical ideas within the scope equivalent thereto should be construed as being included in the scope of the present invention.

The invention claimed is:

1. An apparatus for diagnosing battery cells in a battery module of a battery, the apparatus comprising:
   a voltage measurer configured to measure a voltage of each battery cell of the battery module in a state of an open circuit voltage of the battery;
   a memory that stores the measured voltage at predetermined time intervals; and
   an abnormality detector configured to:
      compare, for each battery cell, a current measured voltage with a measured voltage before a preset time, and
      determine that an abnormality has occurred in a first battery cell among the battery cells when a difference between the current measured voltage of the first battery cell and the measured voltage of the first battery cell before the preset time exceeds a reference value, wherein the open circuit voltage of the battery is a state in which the battery is not charged or discharged.

2. The apparatus of claim 1,
wherein the preset time is 5 seconds.

3. The apparatus of claim 1,
wherein the abnormality detector is further configured to perform abnormality diagnosis of the first battery cell when a state in which the current flowing through the battery module is 0 continues for at least 10 seconds, and a state of charge (SOC) of the first battery cell is equal to or greater than a preset numerical value.

4. The apparatus of claim 3,
wherein the preset numerical value of the SOC is 30%.

5. The apparatus of claim 1,
wherein the abnormality detector performs an abnormality diagnosis of the first battery cell when 10 seconds have elapsed from a time point when charging or discharging of the battery is finished and the current flowing through the battery module is 0.

6. The apparatus of claim 1,
wherein the difference between the current measured voltage and the measured voltage before the preset time includes both a voltage drop amount and a voltage rise amount of the first battery cell.

7. The apparatus of claim 1,
wherein the abnormality detector determines that an abnormality has occurred in the first battery cell when the state in which the difference between the current measured voltage of the first battery cell and the measured voltage of the first battery cell before the preset time exceeds the reference value occurs at least two times in succession.

8. The apparatus of claim 1,
wherein the reference value is 10 mV.

9. An apparatus for diagnosing battery cells in a battery module of a battery, the apparatus comprising:
a voltage measurer configured to measure a voltage of each battery cell of the battery, module in a state of an open circuit voltage of the battery;
an SOC calculator configured to calculate an SOC of each battery cell of the battery module based on the measured voltage;
a memory that stores the measured voltage and the calculated SOC at predetermined time intervals; and
an abnormality detector configured to:
compare, for each battery cell, a current SOC with an SOC before a preset time, and
determine that an abnormality has occurred in a first battery cell among the battery cells when a difference between the current SOC of the first battery cell and the SOC of the first battery cell before the preset time exceeds a reference value,
wherein the open circuit voltage of the battery is a state in which the battery is not charged or discharged.

10. A method for diagnosing battery cells in a battery module of a battery, the method comprising:
measuring a voltage of each battery cell of the battery module in a state of an open circuit voltage of the battery;
storing the measured voltage at predetermined time intervals;
comparing, for each battery cell, a current measured voltage with a measured voltage before a preset time; and
determining that an abnormality has occurred in a first battery cell among the battery cells when a difference between the current measured voltage of the first battery cell and the measured voltage of the first battery cell before the preset time exceeds a reference value,
wherein the open circuit voltage of the battery is a state in which the battery is not charged or discharged.

11. The method of claim 10,
wherein the preset time is 5 seconds.

12. The method of claim 10, further comprising:
before the comparing the current measured voltage with the measured voltage before the preset time for each battery cell, measuring a current flowing through the battery module and an SOC of the battery cells,
wherein comparing the current measured voltage and the measured voltage before the preset time is performed when a state in which the current flowing through the battery module is 0 continues for at least 10 seconds and a state of charge (SOC) of the battery cell is equal to or greater than a preset numerical value.

13. The method of claim 12,
wherein the preset numerical value of the SOC is 30%.

14. The method of claim 10, further comprising:
before the comparing the current measured voltage with the measured voltage before the preset time for each battery cell, measuring a current flowing through the battery module,
wherein the comparing the current measured voltage with the measured voltage before the preset time for each battery cell is performed when 10 seconds have elapsed from a time point when charging or discharging of the battery is finished and the current flowing through the battery module is 0 in the measuring the current flowing through the battery module.

15. The method of claim 10,
wherein the difference between the current measured voltage and the measured voltage before the preset time includes both a voltage drop amount and a voltage rise amount of the first battery cell.

16. The method of claim 10,
wherein it is determined that an abnormality has occurred in the first battery cell when a case in which the difference between the current measured voltage of the first battery cell and the measured voltage of the first battery cell before the preset time exceeds the reference value occurs at least two times in succession, in the determining that the abnormality has occurred in the first battery cell.

17. A method for diagnosing battery cells in a battery module of a battery, the method comprising:
measuring a voltage of each battery cell of the battery module in a state of an open circuit voltage of the battery;
calculating a state of charge (SOC) of each battery cell of the battery module based on the measured voltage;
storing the calculated SOC at predetermined time intervals;
comparing, for each battery cell, a current SOC with an SOC before a preset time; and determining that an abnormality has occurred in a first battery cell among the battery cells when a difference between the current SOC of the first battery cell and the SOC of the first battery cell before the preset time exceeds a reference value, wherein the open circuit voltage of the battery is a state in which the battery is not charged or discharged.

\* \* \* \* \*